United States Patent
Shankar et al.

(10) Patent No.: US 9,522,514 B2
(45) Date of Patent: Dec. 20, 2016

(54) SUBSTRATE OR PANEL WITH RELEASABLE CORE

(71) Applicant: Intel Corporation, Santa Clara, CA (US)

(72) Inventors: Ravi Shankar, Chandler, AZ (US); Ching-Ping Janet Shen, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 14/135,168

(22) Filed: Dec. 19, 2013

(65) Prior Publication Data
US 2015/0174858 A1    Jun. 25, 2015

(51) Int. Cl.
*B32B 7/12* (2006.01)
*B32B 17/06* (2006.01)
*B32B 27/38* (2006.01)
*B32B 38/10* (2006.01)
*B32B 15/04* (2006.01)
*B32B 15/08* (2006.01)
*B32B 15/20* (2006.01)
(Continued)

(52) U.S. Cl.
CPC ............. *B32B 7/12* (2013.01); *B32B 15/043* (2013.01); *B32B 15/08* (2013.01); *B32B 15/20* (2013.01); *B32B 17/06* (2013.01); *B32B 27/20* (2013.01); *B32B 27/283* (2013.01); *B32B 27/38* (2013.01); *B32B 38/10* (2013.01); *H05K 3/025* (2013.01); *B32B 2037/243* (2013.01); *B32B 2037/268* (2013.01); *B32B 2262/101* (2013.01); *B32B 2270/00* (2013.01); *B32B 2307/202* (2013.01); *B32B 2307/748* (2013.01); *B32B 2311/12* (2013.01); *H05K 3/0097* (2013.01); *Y10T 156/10* (2015.01); *Y10T 428/24612* (2015.01); *Y10T 428/24942* (2015.01)

(58) Field of Classification Search
CPC ............. B32B 7/12; B32B 27/38; B32B 38/10
See application file for complete search history.

(56) References Cited

U.S. PATENT DOCUMENTS

| 5,063,658 | A | 11/1991 | Wild |
| 5,306,670 | A | 4/1994 | Mowatt et al. |

(Continued)

OTHER PUBLICATIONS

U.S. Appl. No. 14/227,750, Restriction Requirement mailed Jul. 29, 2015, 5 pgs.

(Continued)

*Primary Examiner* — Victor Chang
(74) *Attorney, Agent, or Firm* — Schwegman Lundberg & Woessner, P.A.

(57) ABSTRACT

Generally discussed herein are systems and apparatuses that can include a base with one or more recesses therein. The disclosure also includes techniques of making and using the systems and apparatuses. According to an example a technique of making a releasable core panel can include providing a releasable core, the releasable core including a first conductive foil integrally coupled with a base at a first side of the base and a first side of the conductive foil, the first conductive foil situated in a first recess in the first side of the base. The technique can include releasably coupling a second conductive foil to a second side of the first conductive foil through a temporary adhesive layer integrally coupled to a first side of the second conductive foil, the second side of the first conductive foil opposite the first side of the first conductive foil.

10 Claims, 9 Drawing Sheets

(51) Int. Cl.
*B32B 27/20* (2006.01)
*B32B 27/28* (2006.01)
*H05K 3/02* (2006.01)
*B32B 37/24* (2006.01)
*B32B 37/26* (2006.01)
*H05K 3/00* (2006.01)

(56) References Cited

U.S. PATENT DOCUMENTS

| | | | |
|---|---|---|---|
| 5,806,177 | A | 9/1998 | Hosomi et al. |
| 5,942,314 | A | 8/1999 | Fisher et al. |
| 6,175,084 | B1 | 1/2001 | Saitoh et al. |
| 6,523,734 | B1 | 2/2003 | Kawai et al. |
| 6,663,980 | B1 | 12/2003 | Saijo et al. |
| 7,222,421 | B2 | 5/2007 | Nakamura |
| 9,161,452 | B2 | 10/2015 | Huang |
| 9,434,135 | B2 | 9/2016 | Erie et al. |
| 2005/0082669 | A1 | 4/2005 | Saijo et al. |
| 2007/0095471 | A1 | 5/2007 | Ito et al. |
| 2007/0124924 | A1 | 6/2007 | Nakamura |
| 2007/0277909 | A1 | 12/2007 | Tsukahara et al. |
| 2008/0053686 | A1 | 3/2008 | Ishii et al. |
| 2008/0054448 | A1 | 3/2008 | Lu et al. |
| 2008/0202661 | A1 | 8/2008 | Kobayashi |
| 2009/0025217 | A1 | 1/2009 | Kamei |
| 2010/0084748 | A1 | 4/2010 | Poddar et al. |
| 2011/0154657 | A1 | 6/2011 | Chuang et al. |
| 2011/0155443 | A1 | 6/2011 | Maeda et al. |
| 2013/0143062 | A1 | 6/2013 | Kaneko et al. |
| 2014/0036465 | A1 | 2/2014 | Hu et al. |
| 2014/0078706 | A1 | 3/2014 | Hu et al. |
| 2014/0090879 | A1 | 4/2014 | Seneviratne et al. |
| 2014/0177193 | A1 | 6/2014 | Jin et al. |
| 2014/0300009 | A1 | 10/2014 | Hsu |
| 2014/0305683 | A1 | 10/2014 | Li |
| 2014/0367155 | A1 | 12/2014 | Huang |
| 2015/0008566 | A1 | 1/2015 | Gerber et al. |
| 2015/0111000 | A1 | 4/2015 | Sasaki |
| 2015/0174859 | A1 | 6/2015 | Erie et al. |
| 2015/0181713 | A1 | 6/2015 | Shen et al. |
| 2015/0181717 | A1 | 6/2015 | Shen et al. |
| 2016/0035661 | A1 | 2/2016 | Suzuki |

OTHER PUBLICATIONS

U.S. Appl. No, 14/227,750, Response filed Aug. 11, 2015 to Restriction Requirement mailed Jul. 29, 2015, 8 pgs.
Chiu, H. T, et al., "Study on mechanical properties and intermolecular interaction of silicone rubber/polyurethane/epoxy blends", Journal of Applied Polymer Science, 89(4), (Jul. 25, 2003), 959-970.
Hou, S. S, et al., "Function and performance of silicone copolymer. Part IV. Curing behavior and characterization of epoxy—siloxane copolymers blended with diglycidyl ether of bisphenol-A", Polymer, 41(9), (Apr. 2000), 3263-3272.
U.S. Appl. No. 14/227,697, Non Final Office Action mailed May 9, 2016, 20 pgs.
U.S. Appl. No. 14/227,723, Non Final Office Action mailed May 20, 2016, 26 pgs.
U.S. Appl. No. 14/227,750, Advisory Action mailed Apr. 6, 2016, 3 pgs.
U.S. Appl. No. 14/227,750, Examiner Interview Summary mailed Mar. 2, 2016, 3 pgs.
U.S. Appl. No. 14/227,750, Notice of Allowance mailed May 11, 2016, 7 pgs.
U.S. Appl. No. 14/227,750, Response filed Mar. 25, 2016 to Final Office Action mailed Feb. 3, 2016, 5 pgs.
U.S. Appl. No. 14/227,750, Response filed Apr. 19, 2016 to Advisory Action mailed Apr. 6, 2016, 5 pgs.
"U.S. Appl. No. 14/227,697, Examiner Interview Summary mailed Jul. 13, 2016", 3 pgs.
"U.S. Appl. No. 14/227,697, Notice of Allowance mailed Sep. 12, 2016", 12 pgs.
"U.S. Appl. No. 14/227,697, Response filed Jul. 8, 2016 to Non Final Office Action mailed May 9, 2016", 8 pgs.
"U.S. Appl. No. 14/227,723, Examiner Interview Summary mailed Jul. 14, 2016", 3 pgs.
"U.S. Appl. No. 14/227,723, Notice of Allowance mailed Sep. 14, 2016", 10 pgs.
"U.S. Appl. No. 14/227,729, Response filed Jul. 8, 2016 to Non Final Office Action mailed May 20, 2016", 9 pgs.

SUBSTRATE OR PANEL WITH RELEASABLE CORE

TECHNICAL FIELD

Examples generally relate to substrate architectures that can include a releasable or reusable core.

TECHNICAL BACKGROUND

Substrate manufacturing technology can include the use of panels to help increase the number of dies that can be manufactured at a given time. Substrate manufacturing can be inefficient or wasteful and cost prohibitive. Such problems can be prevalent when building substrates using one or more panels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate to substrates or panels, such as panels that can include coreless substrates, and methods of making and using the same. Examples also relate to systems that can include one or more of the substrates or panels.

Figure 1:
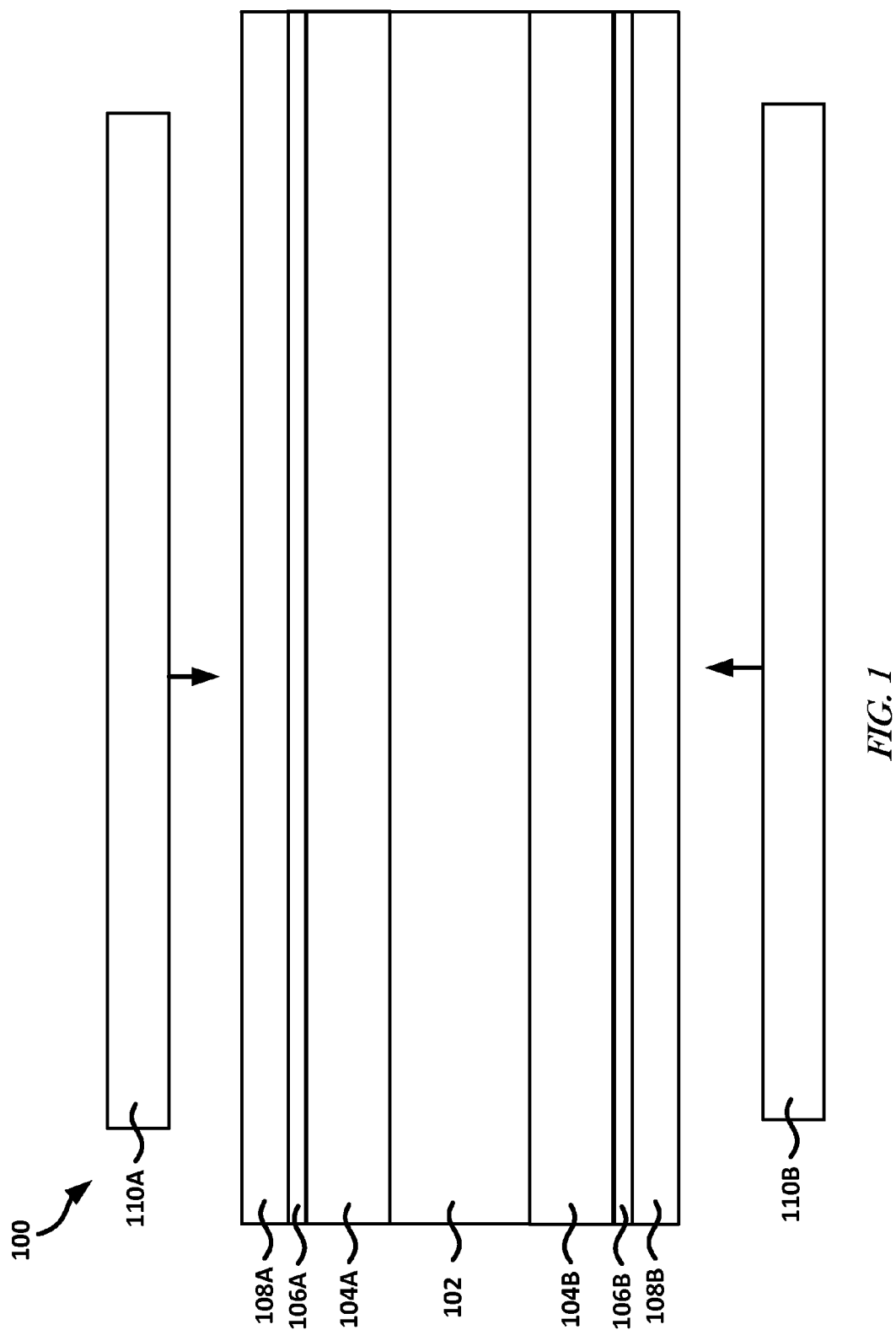
FIG. 1 shows an example of a core panel.

FIG. 1 shows a core panel 100. The core panel 100 can be substantially similar to a core panel currently received at a Substrate Packaging Technology Development (SPTD) factory. The core panel can include a generally rectangular base 102, one or more inner conductive foils 104A or 104B, one or more temporary adhesive layers 106A or 106B, or one or more outer conductive foils 108A or 108B. One or more Dry Film Resist (DFR) layers 110A or 110B can be situated on the core panel 100, such as at the SPTD factory, such as shown in FIG. 1.

Figure 2:
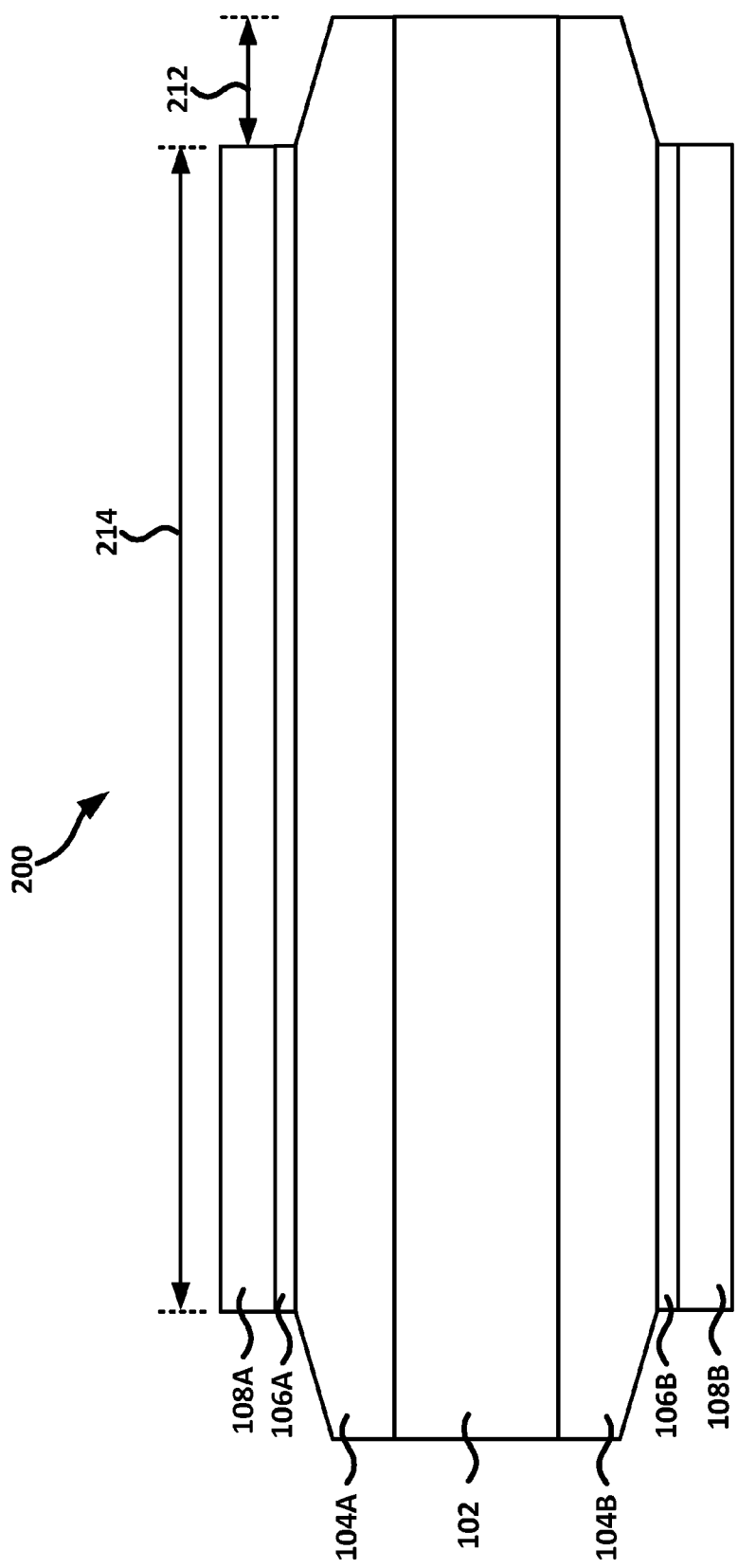
FIG. 2 shows the example core panel of FIG. 1 after material has been removed from the core panel.

A panel, such as the core panel 100, can undergo processing before a substrate is formed on the panel, such as at a SPTD factory. The core panel 100 can undergo an etching process, such as to produce the core panel 200 shown in FIG. 2. The etching process can expose the outer conductive foil 108A-B, at least partially remove the DFR layers 110A-B, or remove a portion of the inner conductive foils 104A-B, temporary adhesive layers 106A-B, or outer conductive foils 108A-B. The etching process can cause a width, indicated by the line 212, to be unsuitable for building a substrate thereon in a substrate building process. The width, indicated by the line 214, can be the area of the core panel 200 that is suitable for building a substrate thereon in the substrate building process. The substrate can be built on the outer conductive foil 108A-B.

A substrate built on the outer conductive foil 108A-B can be released from (e.g., pulled off of or otherwise removed from) the panel, such as at the temporary adhesive layer 106A-B. The outer conductive foil 108A-B can be separated from the core panel 200. Since the temporary adhesive layer 106A-B and the outer conductive foils 108A-B typically come in panels, the temporary adhesive layer generally cannot be reapplied to the inner conductive foil 104A-B. This is because the inner conductive foil 104A-B has diminished in surface area, such as at or near the width indicated by line 212, so as to prohibit the application of a temporary adhesive layer 106A-B panel to the inner conductive foil 104A panel. Thus, the panel that includes the base 102 and the inner conductive foils 104A-B is typically discarded and a new panel is brought in for processing.

The temporary adhesive layers 106A-B can be made of methyl ethyl ketone and toluene solvents with polydimethyl siloxane and bisphenol A based epoxy. Temporary adhesive layers 106A-B made from these materials can suffer from phase separation between the epoxy and silicone over time. Heat can cause blisters to form in temporary adhesive layers 106A-B made from these materials. The adhesive strength of such temporary adhesive layers 106A-B can degrade over time. Temporary adhesive layers made of these materials can have poor line yields, such as in a SPTD factory.

The outer conductive foil 108A can be a micro thin copper panel. This panel can be costly, such as compared to a thicker copper panel. This outer conductive foil 108A can typically be about 5 micrometers thick.

Figure 3:
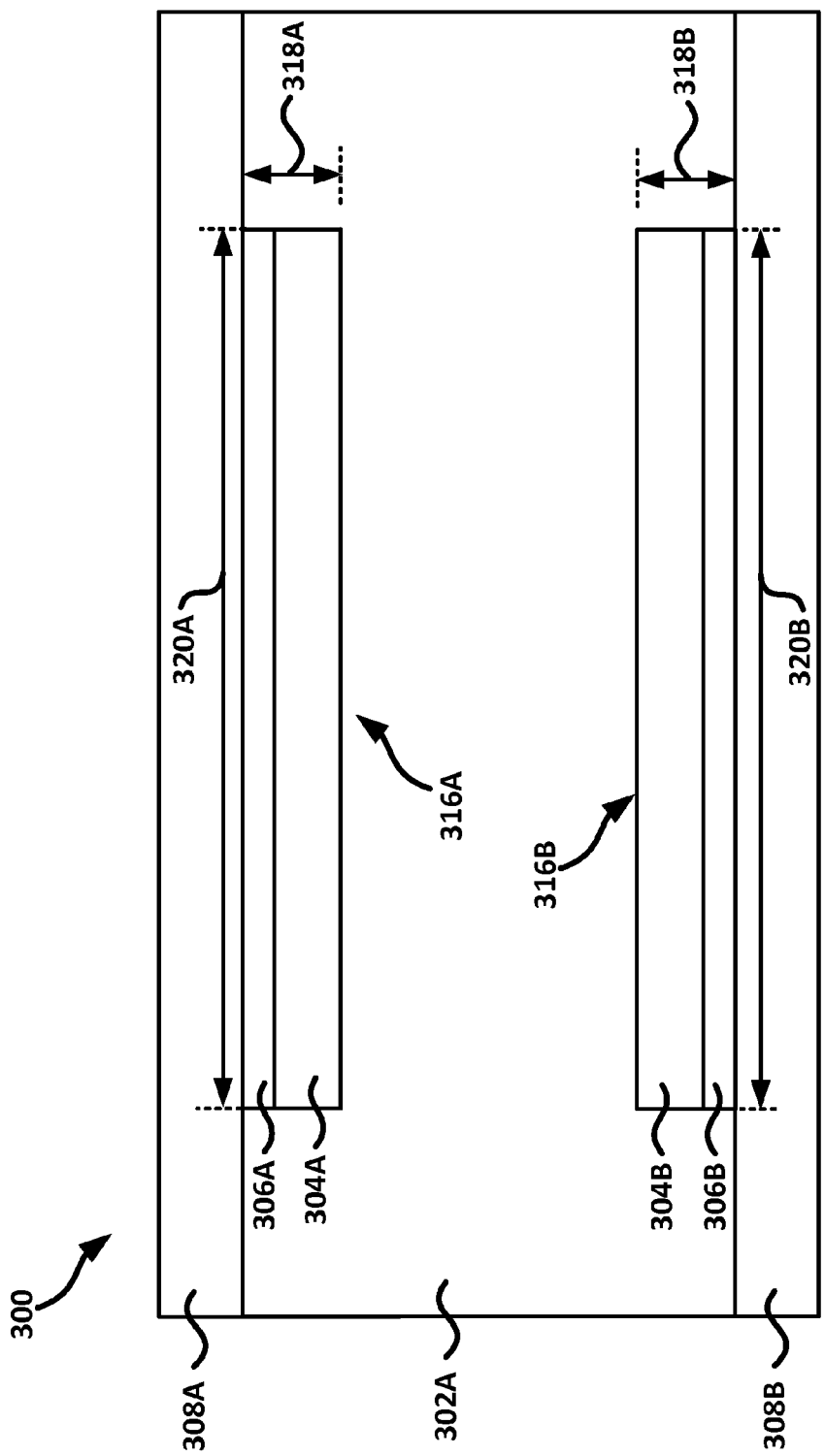
FIG. 3 shows an example of another core panel.

FIG. 3 shows an example of a core panel 300. When the core panel 300 is received a SPTD factory, one or more substrates can be formed on the core panel 300 (see FIG. 6, for example), such as without performing any processing on the core panel 300 before forming the substrates. Such processing is described, with regard to FIG. 2, for example.

The core panel 300 can include a base 302A, one or more inner conductive foils 304A or 304B, one or more temporary adhesive layers 306A or 306B, or one or more outer conductive foils 308A or 308B.

The base 302A can include one or more recesses 316A or 316B formed therein. The recess 316A-B can include a depth, such as indicated by lines 318A and 318B, respectively and a width, such as indicated by lines 320A and 320B, respectively. The recess 316A-B can be configured to accommodate a substantial portion or all of the temporary adhesive layer 306A-B, such as to allow the temporary adhesive layer 306A-B to reside at least partially in the recess 316A-B and also make contact with the inner conductive foil 304A-B, such as to form a releasable (e.g., adhesive) coupling between the inner conductive foil 304A-B and the temporary adhesive layer 306A-B. The base 302A can be generally shaped as a sideways capital "I", such as in a vertical cross-section of the base 302A, such as shown in FIG. 3. The base 302A can be made of an epoxy resin, glass cloth, other base material, or a combination thereof. The base 302A can be made of a cured prepreg.

The inner conductive foil 304A-B can be situated at least partially within the recess 316A-B. The inner conductive foil 304A-B can be made of copper, aluminum, or other conductive material. The inner conductive foil 304A-B can include a height (e.g., a dimension substantially parallel to the line 318A-B) of about one micrometer to greater than a millimeter. In one or more embodiments, the inner conductive foil 304A-B can be between about five and eighteen micrometers in height.

The temporary adhesive layer 306A-B can releasably or mechanically couple the inner conductive foil 304A-B to the outer conductive foil 308A-B, respectively. As used herein releasably coupling means to couple such that a mechanical coupling through the temporary adhesive layer 306A-B can be broken without requiring excessive force or damaging the items mechanically coupled through the temporary adhesive layer 306A-B. The temporary adhesive layer 306A-B can be released from an item by exerting a relatively small amount of force, such as about five Newtons per meter to about one hundred Newtons per meter.

The temporary adhesive layer 306A-B can be made of one or more epoxy silicone copolymers or blends of polymers, silicone, or epoxy. Different blends can be used to make temporary adhesive layers 306A-B with varying mechanical properties, such as depending on the volume weight percent of polymer, silicone, or epoxy used. The mechanical properties can include hardness, elasticity, stickiness, or other mechanical property.

The temporary adhesive layer 306A-B can be made of an epoxy and silicone blend. For example, siloxane and epoxy resin can be blended together with a carboxylic acid anhydride hardener, such as to produce a stable or well-blended temporary adhesive layer 306A-B. This blend can be used as an adhesive by controlling the siloxane to epoxy resin ratio. By increasing the proportion of siloxane, a temporary adhesive layer 306A-B with a reduced elastic modulus can be produced.

The temporary adhesive layer 306A-B can be made of a blend of co-polymer, epoxy, or silicone. A co-polymer of siloxane and epoxy can be produced and mixed with an epoxy resin. Polysiloxane can have an epoxide group on a side chain thereof and can be synthesized from methylhydrosiloxane, epoxy resin.

The outer conductive foils 308A-B can be situated on a surface of the base 302A. The outer conductive foil 308A-B can be integrally coupled with or attached to the temporary adhesive layer 306A, such that when the outer conductive foil 308A-B is decoupled from the core panel 300, the temporary adhesive layer 306A-B is also decoupled from the core panel 300, such as by breaking a releasable coupling between the temporary adhesive layer 306A-B and the inner conductive foil 304A-B. An integral or other mechanical coupling between the outer conductive foil 308A-B and the temporary adhesive layer 306A-B can be a stronger coupling than a releasable coupling between the temporary adhesive layer 306A-B and the inner conductive foil 304A-B.

The outer conductive foil 308A-B can be made of copper, aluminum, or other conductive material. The inner conductive foil 304A-B can include a height (e.g., a dimension substantially parallel to the line 318A) of about one micrometer to greater than one millimeter. In one or more embodiments, the outer conductive foil 308A-B can be between about five and about eighteen micrometers in height.

Figure 4:
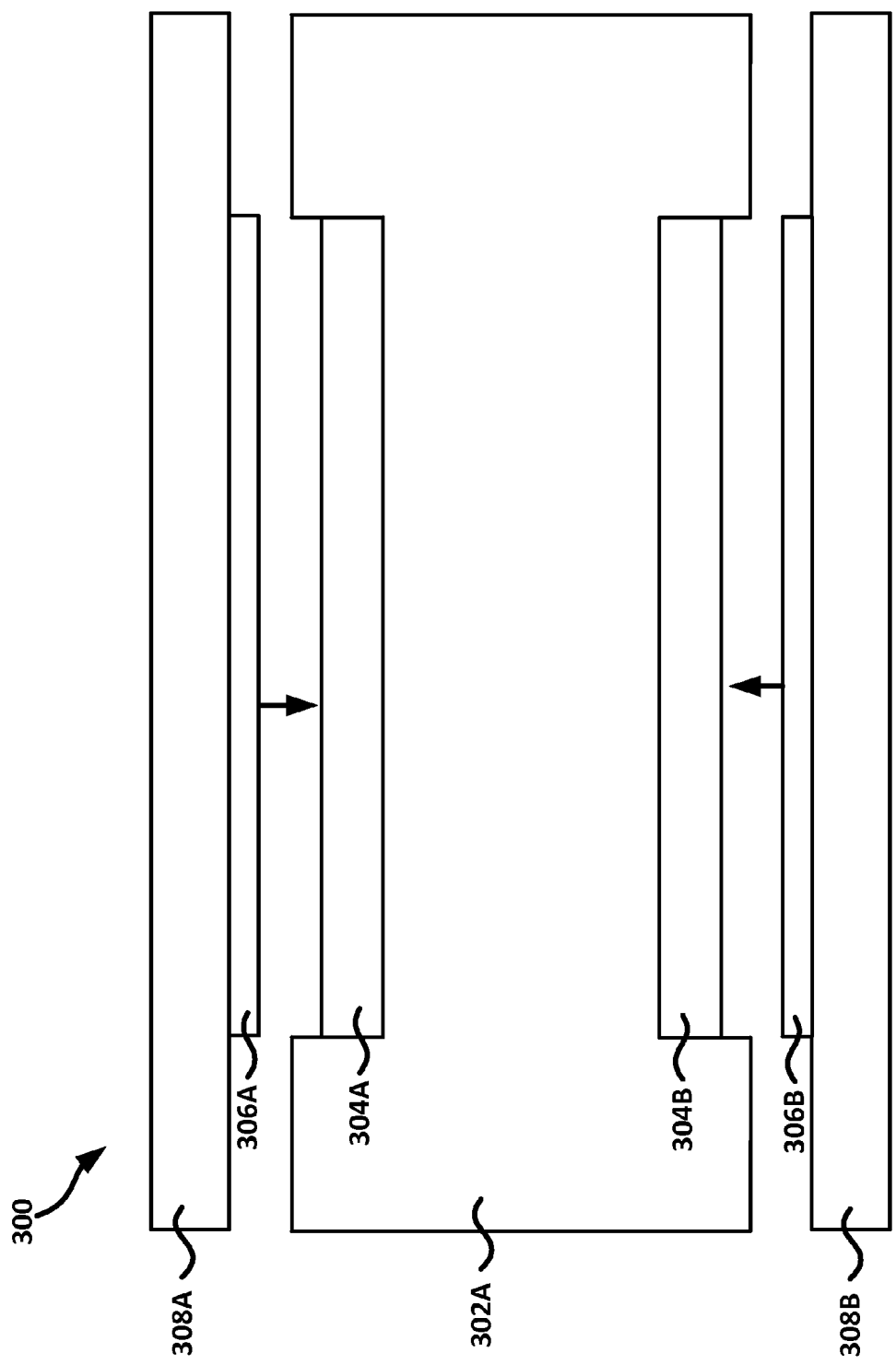
FIG. 4 shows the core panel of FIG. 3 prior to coupling a conductive foil to a base.

FIG. 4 shows the core panel 300 of FIG. 3 prior to releasably coupling the outer conductive foil 308A-B to the base 302A. The temporary adhesive layers 306A-B can be pressed (e.g., hot pressed, baked with pressure, or laminated) into the inner conductive foils 304A-B. Such pressing can form a releasable coupling between the inner conductive foil 304A-B and the outer conductive foil 308A-B, such as shown in FIG. 3. The base 302A and the inner conductive foil 304A-B can be reused by releasably uncoupling (e.g., pulling) the inner conductive foil 304A-B from the outer conductive foil 308A-B. More details regarding reusing the base 302A and inner conductive foil 304A-B panel are explained with regard to FIG. 6.

Figure 5:
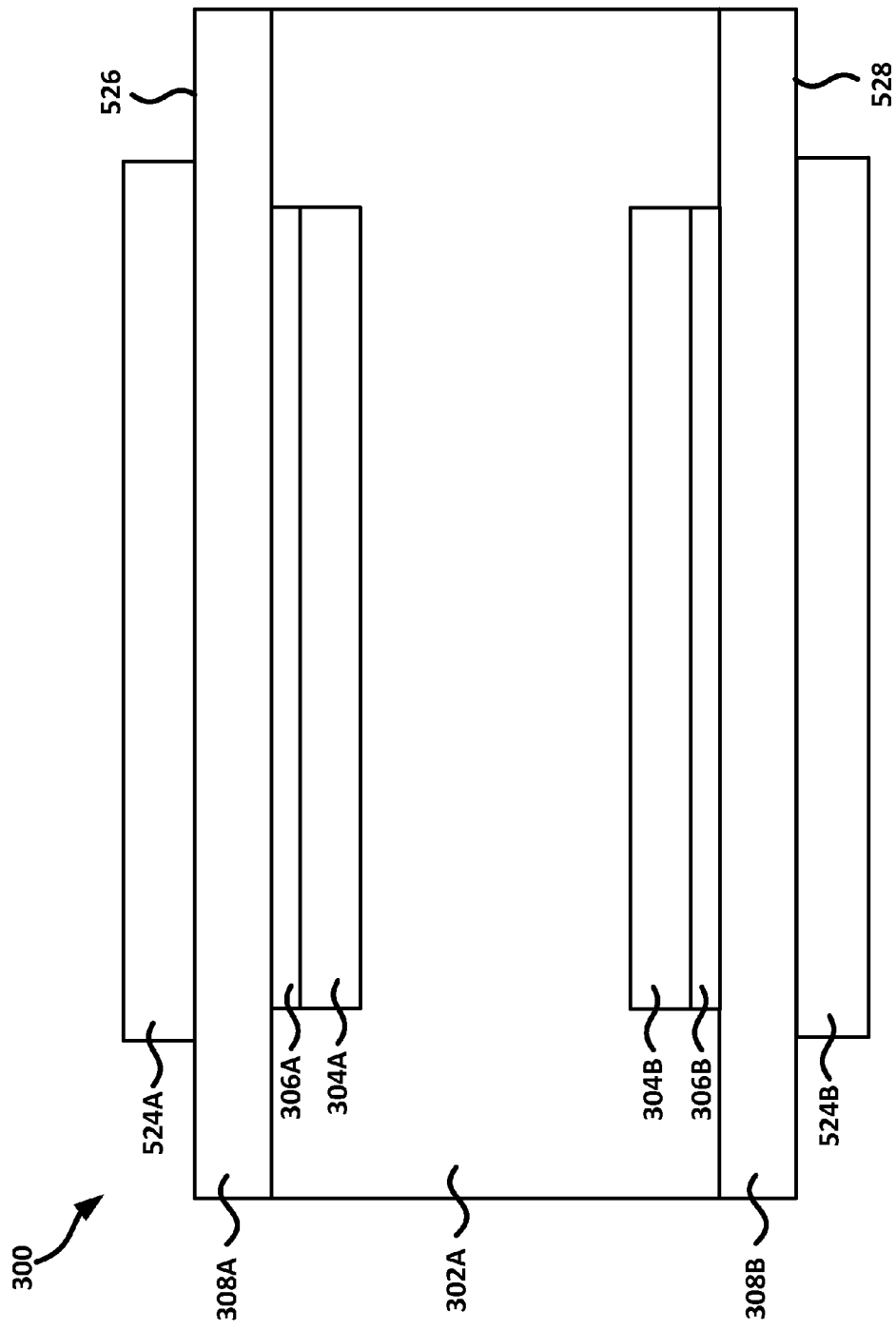
FIG. 5 shows an example of the panel of FIG. 3 after substrates have been formed on the top and bottom surfaces of the core panel.

FIG. 5 shows the core panel 300 of FIG. 3 with one or more substrates 524A or 524B formed on a top surface 526 or a bottom surface 528 of the core panel 300, respectively. The substrate 524A-B can be formed on the outer conductive foil 308A-B, respectively. The substrate 524A-B can be a Bumpless BuildUp Layer (BBUL) substrate, a Flip Chip substrate, or other type of substrate. The substrate 524A-B can be a coreless substrate, such as a substrate that does not include a die situated in the substrate.

Figure 6:
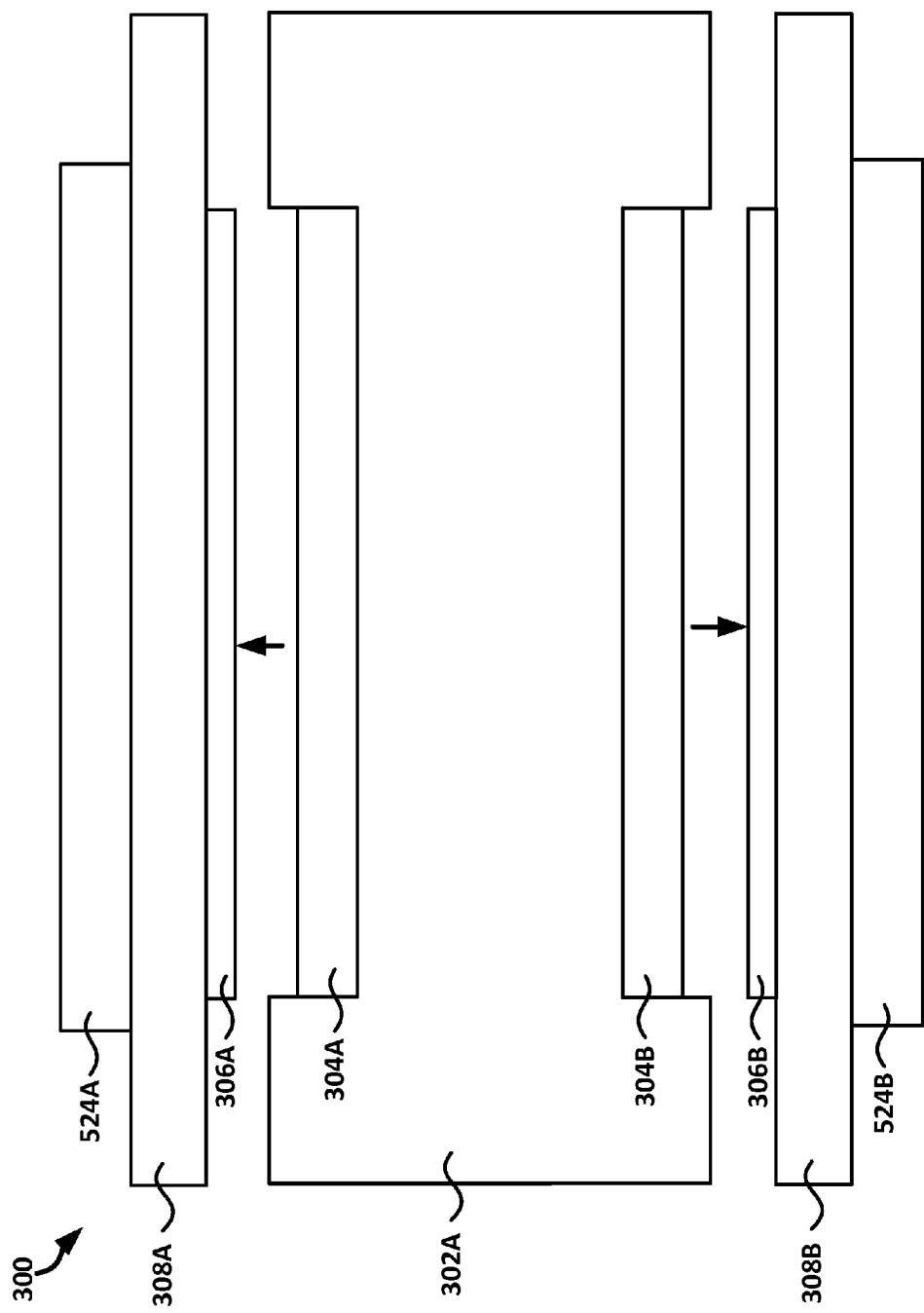
FIG. 6 shows an example of the panel of FIG. 6 after substrates and conductive foils have been released from the core panel.

FIG. 6 shows the core panel 300 of FIG. 5 with the outer conductive foil 308A-B releasably decoupled from the inner conductive foil 304A-B. Releasably decoupling the inner conductive foil 304A-B from the outer conductive foil 308A-B can include chemical etching or pulling so as to remove the outer conductive foil 308A-B from the core panel 300. The panel including the base 302A or the inner conductive foil 304A-B (in embodiments that include the inner conductive foil 304A-B, see FIG. 4 for an example of an embodiment that does not include the inner conductive foil 304A-B) can be reused. Reusing can include hot pressing or otherwise releasably coupling another outer conductive foil 308A-B or temporary adhesive layer 306A-B to the base 302A panel, such as a base panel with or without the inner conductive foil 304A-B.

Figure 7:
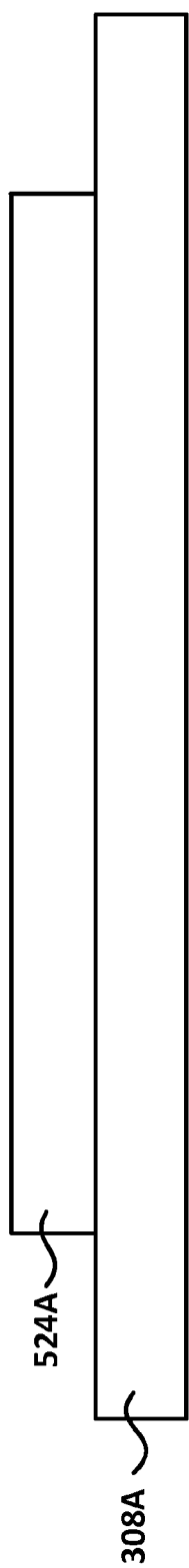
FIG. 7 shows the conductive foil and substrate after a temporary adhesive layer has been removed from a conductive foil.

FIG. 7 shows the substrate 524A and the outer conductive foil 308A of FIG. 6 with the temporary adhesive layer 306A removed from the outer conductive foil 308A. The temporary adhesive layer 306A can be removed by wet blasting, mechanical etching, chemical etching, laser ablation, a combination thereof, or other process of removing the temporary adhesive layer 306A.

By including a base 302A-B panel in a substrate manufacturing process, costs can be reduced, such as by allowing the base 302A-B panel (e.g., with or without the inner conductive foil 304A-B) to be reused. Including the base 302A-B in the process of making a substrate can also simplify the manufacturing process, such as by removing base panel buildup steps or one or more etch steps from the substrate manufacturing process. By making the inner conductive foil 304A-B or the outer conductive foil 308A-B thicker than five micrometers, the cost can be reduced. By including base 302A-B the active area (e.g., the area on which substrates can be formed) can be increased compared to a process that includes an etch step, such as described with regard to FIGS. 1 and 2.

Figure 8:
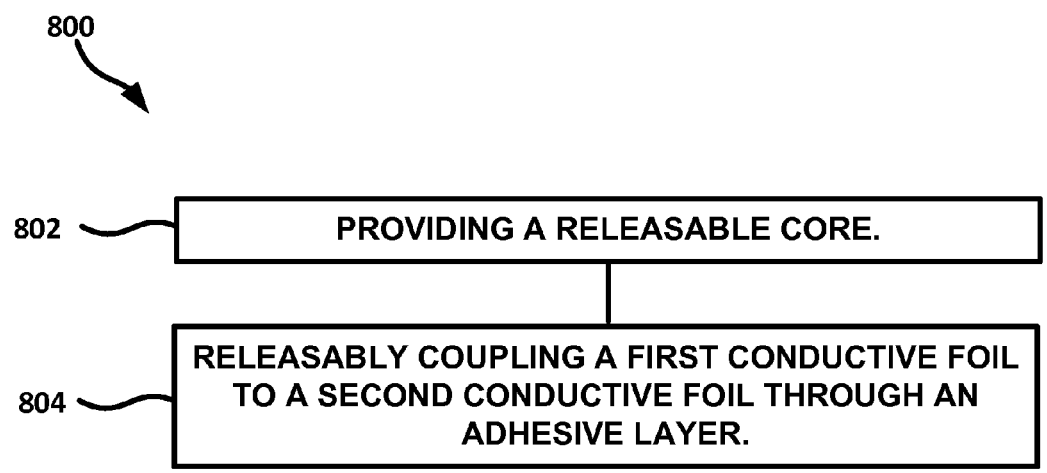
FIG. 8 shows an example of a technique for making a core panel.

FIG. 8 shows an example of a technique 800 for making a core panel, such as a core panel discussed herein. At 802, a releasable core (e.g., a base, such as base similar to 302A-B or one or more inner conductive foils 304A-B) can be provided. The releasable core can include a first conductive foil 304A integrally coupled with a base 302A at a first side of the base 302A and a first side of the conductive foil 304A, the first conductive foil 304A situated in a first recess 316A in the first side of the base 302A. At 804, a second conductive foil 308A can be releasably coupled to a second side of the first conductive foil 304A through a temporary adhesive layer 306A integrally coupled to a first side of the second conductive foil 308A. The second side of the first conductive foil 304A opposite the first side of the first conductive foil 304A. Releasably coupling the first temporary adhesive layer 306A can include hot pressing the first temporary adhesive layer 306A into the first conductive foil 304A.

The technique 800 can include forming a first substrate 524A on a second side of the second conductive foil 308A. The first substrate 524A can be a BBUL substrate. The first substrate 524A can be a coreless substrate. The second side of the second conductive foil 308A can be opposite the first side of the second conductive foil 308A. The releasable core can include a third conductive foil 304B integrally coupled with the base 302A at a second side of the base 302A and a first side of the third conductive foil 304B. The third conductive foil 304B can be situated in a second recess 316B in a second side of the base 302A, the second side of the base 302A opposite the first side of the base 302A. The technique 800 can further include releasably coupling a fourth conductive foil 308B to a second side of the third conductive foil 304B through a second temporary adhesive layer 306B integrally coupled to a first side of the fourth conductive foil 308B, the second side of the third conductive foil 308B opposite the first side of the third conductive foil 308B.

The technique 800 can include forming a second substrate 524B on a second side of the fourth conductive foil 308B. The second substrate can be a BBUL substrate. The second substrate 524B can be a coreless substrate. The second side of the fourth conductive foil 308B can be opposite the first side of the fourth conductive foil 308B. The technique 800 can include releasing (e.g., pulling or otherwise decoupling) the second conductive foil 308A and the fourth conductive foil 308B from the releasable core. The technique 800 can include reusing the releasable core by attaching another conductive foil to the first conductive foil of the releasable core. The technique 800 can include removing the first temporary adhesive layer 306A from the second conductive foil 308A.

Figure 9:
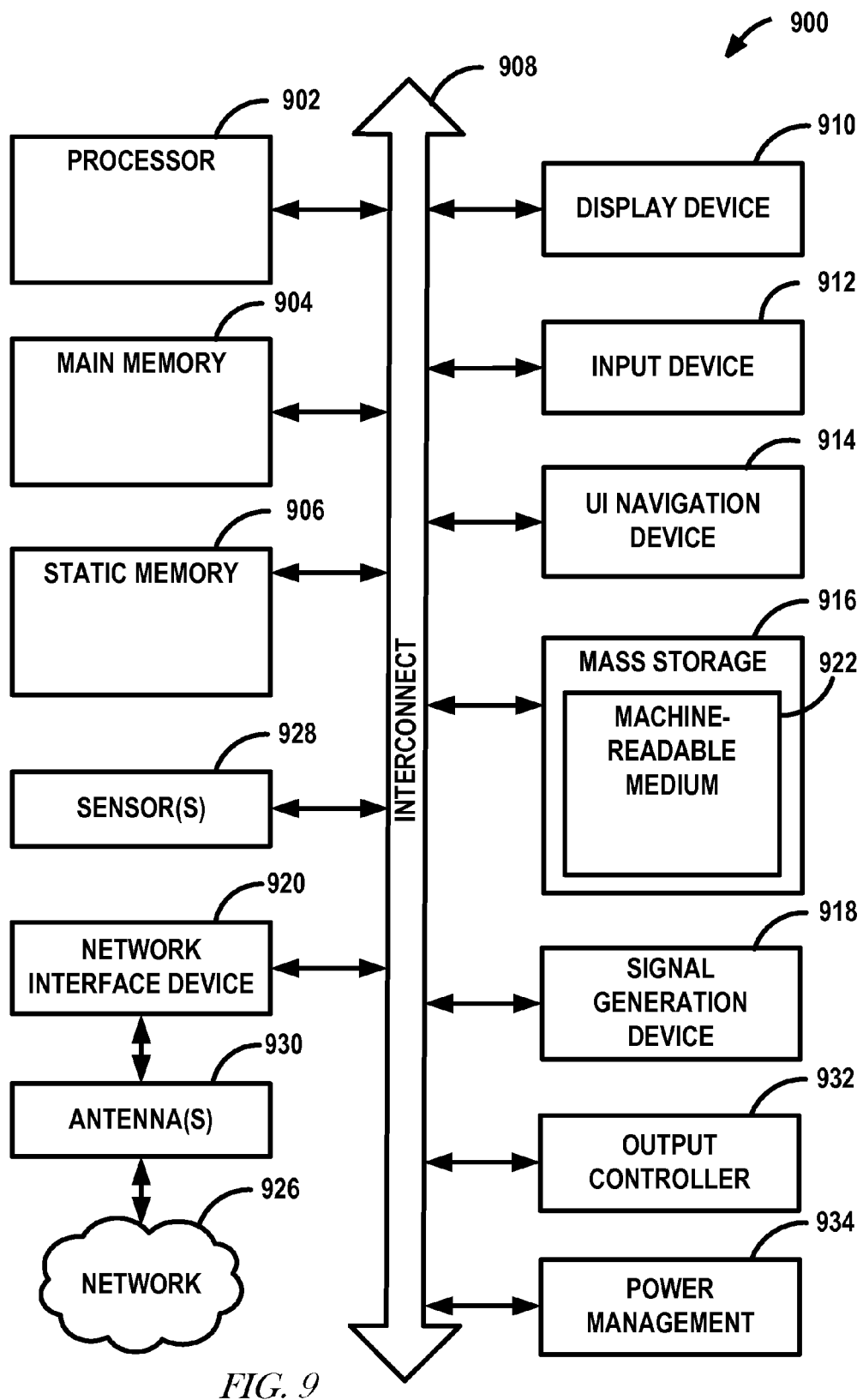
FIG. 9 shows an example of a computer system.

FIG. 9 is a block diagram illustrating an example computer system 900 machine which can include a reusable core panel discussed herein. Computer system 900 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 900 can include a processor 902 (e.g., a Central Processing Unit (CPU), a Graphics Processing Unit (GPU) or both), a main memory 904 and a static memory 906, which communicate with each other via an interconnect 908 (e.g., a link, a bus, etc.). The computer system 900 can further include a video display unit 910, an alphanumeric input device 912 (e.g., a keyboard), and a User Interface (UI) navigation device 914 (e.g., a mouse). In an example, the video display unit 910, input device 912 and UI navigation device 914 are a touch screen display. The computer system 900 can additionally include a storage device 916 (e.g., a drive unit), a signal generation device 918 (e.g., a speaker), an output controller 932, a power management controller 934, and a network interface device 920 (which can include or operably communicate with one or more antennas 930, transceivers, or other wireless communications hardware), and one or more sensors 928, such as a GPS sensor, compass, location sensor, accelerometer, or other sensor. The antennas 930 can be coupled to a network 926.

Examples and Notes

The present subject matter may be described by way of several examples.

Example 1 can include or use subject matter (such as an apparatus, a method, a means for performing acts, or a device readable memory including instructions that, when performed by the device, can cause the device to perform acts), such as can include or use providing a releasable core, the releasable core including a first conductive foil integrally coupled with a base at a first side of the base and a first side of the conductive foil, the first conductive foil situated in a first recess in the first side of the base, and releasably coupling a second conductive foil to a second side of the first conductive foil through a temporary adhesive layer integrally coupled to a first side of the second conductive foil, the second side of the first conductive foil opposite the first side of the first conductive foil.

Example 2 can include or use, or can optionally be combined with the subject matter of Example 1, to include or use forming a first substrate on a second side of the second conductive foil, the second side of the second conductive foil opposite the first side of the second conductive foil.

Example 3 can include or use, or can optionally be combined with the subject matter of at least one of Examples 1-2, to include or use wherein the releasable core further includes a third conductive foil integrally coupled with the base at a second side of the base and a first side of the third conductive foil, the third conductive foil situated in a second recess in a second side of the base, the second side of the base opposite the first side of the base. Example 3 can optionally include or use releasably coupling a fourth conductive foil to a second side of the third conductive foil through a second temporary adhesive layer integrally coupled to a first side of the fourth conductive foil, the second side of the third conductive foil opposite the first side of the third conductive foil.

Example 4 can include or use, or can optionally be combined with the subject matter of at least one of Examples 1-3, to include or use forming a second substrate on a second side of the fourth conductive foil, the second side of the fourth conductive foil opposite the first side of the fourth conductive foil.

Example 5 can include or use, or can optionally be combined with the subject matter of at least one of Examples 1-4, to include or use wherein forming the first substrate includes forming a first bumpless buildup layer substrate and forming the second substrate includes forming a second bumpless buildup layer substrate.

Example 6 can include or use, or can optionally be combined with the subject matter of at least one of Examples 1-5, to include or use releasing the second conductive foil and the fourth conductive foils from the releasable core.

Example 7 can include or use, or can optionally be combined with the subject matter of at least one of Examples 1-6, to include or use reusing the releasable core by attaching another conductive foil to the first conductive foil of the releasable core.

Example 8 can include or use, or can optionally be combined with the subject matter of at least one of Examples 1-7, to include or use wherein releasably coupling the first temporary adhesive layer includes hot pressing the first temporary adhesive layer into the first conductive foil.

Example 9 can include or use, or can optionally be combined with the subject matter of at least one of Examples 1-8, to include or use removing the first temporary adhesive layer from the second conductive foil.

Example 10 can include or use, or can optionally be combined with the subject matter of at least one of Examples 1-9, to include or use wherein forming the first substrate includes forming a first coreless substrate and forming the second substrate includes forming a second coreless substrate.

Example 11 can include or use, or can be optionally combined with the subject matter of at least one of Examples 1-10, to include subject matter (such as an apparatus, a method, a means for performing acts, or a device readable memory including instructions that, when performed by the device, can cause the device to perform acts), such as can include or use a temporary adhesive layer including a first width, a first conductive foil integrally coupled with a first side of the temporary adhesive layer, the first conductive foil including a second width, the second width greater than the first width, a second conductive foil releasably coupled to a second side of the temporary adhesive layer at a first side of the second conductive foil, the second side of the temporary adhesive layer opposite the first side of the temporary adhesive layer, and a base integrally coupled to a second side of the second conductive foil, the second side of the conductive foil opposite the first side of the second conductive foil.

Example 12 can include or use, or can optionally be combined with the subject matter of at least one of Examples 1-11, to include or use wherein the second conductive foil is situated in a recess in a first side of the base and the temporary adhesive layer is situated, at least partially, in the recess.

Example 13 can include or use, or can optionally be combined with the subject matter of at least one of Examples 1-12, to include or use wherein the temporary adhesive layer is a first temporary adhesive layer and wherein the second conductive foil is situated on and integrally coupled to the base at a first side of the base. Example 13 can optionally include or use wherein the substrate further included a third conductive foil situated on and integrally coupled to a second side of the base at a first side of the third conductive foil, the second side of the base opposite the first side of the base, and a second temporary adhesive layer releasably coupled to a second side of the third conductive foil at a first side of the second temporary adhesive layer.

Example 14 can include or use, or can optionally be combined with the subject matter of at least one of Examples 1-13, to include or use a fourth conductive foil situated on an integrally coupled with a second side of the second temporary adhesive layer, the second side of the second temporary adhesive layer opposite the first side of the second temporary adhesive layer.

Example 15 can include or use, or can optionally be combined with the subject matter of at least one of Examples 1-14, to include or use wherein the recess is a first recess, wherein the second temporary adhesive layer is situated in a second recess in a second side of the base, wherein the third conductive foil is situated, at least partially, in the second recess, and wherein the second side of the base is opposite the first side of the base.

Example 16 can include or use, or can optionally be combined with the subject matter of at least one of Examples 1-15, to include or use wherein the first and second temporary adhesive layers are selected from the group including (1) epoxy and silicone mixed with a hardener and (2) a co-polymer of epoxy and silicone mixed with an epoxy resin.

Example 17 can include or use, or can be optionally be combined with the subject matter of at least one of Examples 1-16, to include subject matter (such as an apparatus, a method, a means for performing acts, or a device readable memory including instructions that, when performed by the device, can cause the device to perform acts), such as can include or use a base with a first recess in a first side of the base and a second recess in a second side of the base, the first side of the base opposite the second side of the base, a first conductive foil situated in the first recess, and a second conductive foil situated in the second recess.

Example 18 can include or use, or can optionally be combined with the subject matter of at least one of Examples 1-17, to include or use wherein the first and second recesses and the first and second conductive foils are generally rectangular in shape and wherein the first and second recesses extend beyond the first and second conductive foils, respectively.

Example 19 can include or use, or can optionally be combined with the subject matter of at least one of Examples 1-18, to include or use wherein the first and second conductive foils are copper foils.

Example 20 can include or use, or can optionally be combined with the subject matter of at least one of Examples 1-19, to include or use wherein the base is made of glass cloth and epoxy.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
   a temporary adhesive layer including a first width;
   a first conductive foil integrally coupled with a first side of the temporary adhesive layer, the first conductive foil including a second width, the second width greater than the first width;
   a second conductive foil releasably coupled to a second side of the temporary adhesive layer at a first side of the second conductive foil, the second side of the temporary adhesive layer opposite the first side of the temporary adhesive layer; and
   a base integrally coupled to a second side of the second conductive foil, the second side of the conductive foil opposite the first side of the second conductive foil.

2. The device of claim 1, wherein the second conductive foil is situated in a recess in a first side of the base and the temporary adhesive layer is situated, at least partially, in the recess.

3. The device of claim 2, wherein the temporary adhesive layer is a first temporary adhesive layer and wherein the second conductive foil is situated on and integrally coupled to the base at a first side of the base, and the substrate further comprises:
   a third conductive foil situated on and integrally coupled to a second side of the base at a first side of the third conductive foil, the second side of the base opposite the first side of the base; and
   a second temporary adhesive layer releasably coupled to a second side of the third conductive foil at a first side of the second temporary adhesive layer.

4. The device of claim 3, further comprising a fourth conductive foil situated on an integrally coupled with a second side of the second temporary adhesive layer, the second side of the second temporary adhesive layer opposite the first side of the second temporary adhesive layer.

5. The device of claim 4, wherein the recess is a first recess, wherein the second temporary adhesive layer is situated in a second recess in a second side of the base, wherein the third conductive foil is situated, at least partially, in the second recess, and wherein the second side of the base is opposite the first side of the base.

6. The device of claim 5, wherein the first and second temporary adhesive layers are made of one selected from the group comprising (1) epoxy and silicone mixed with a hardener and (2) a co-polymer of epoxy and silicone mixed with an epoxy resin.

7. A reusable, releasable device comprising:
   a base with a first recess in a first side of the base and a second recess in a second side of the base, the first side of the base opposite the second side of the base;
   a first conductive foil situated in the first recess; and
   a second conductive foil situated in the second recess.

8. The reusable, releasable device of claim 7, wherein the first and second recesses and the first and second conductive foils are generally rectangular in shape and wherein the first and second recesses extend beyond the first and second conductive foils, respectively.

9. The reusable, releasable device of claim 8, wherein the first and second conductive foils are copper foils.

10. The reusable, releasable device of claim 9, wherein the base is made of glass cloth and epoxy.

* * * * *